United States Patent [19]
Nakamura et al.

[11] Patent Number: 5,592,222
[45] Date of Patent: Jan. 7, 1997

[54] SENSOR CHIP AND PHOTO-ELECTRIC CONVERSION APPARATUS USING THE SAME

[75] Inventors: Kenichi Nakamura, Isehara; Yoshio Koide, Atsugi, both of Japan

[73] Assignee: Canon Kabushiki Kaisha, Tokyo, Japan

[21] Appl. No.: 465,189

[22] Filed: Jun. 5, 1995

Related U.S. Application Data

[63] Continuation of Ser. No. 150,246, Nov. 9, 1993, abandoned, which is a continuation of Ser. No. 994,446, Dec. 23, 1992, abandoned, which is a continuation of Ser. No. 856,847, Mar. 23, 1992, abandoned, which is a continuation of Ser. No. 476,767, Feb. 8, 1990, abandoned.

[30] Foreign Application Priority Data

Feb. 10, 1989 [JP] Japan ..................... 1-30015
Feb. 10, 1989 [JP] Japan ..................... 1-30016
Feb. 10, 1989 [JP] Japan ..................... 1-30018

[51] Int. Cl.$^6$ ............................. H04N 3/14; H04N 5/335
[52] U.S. Cl. ................... 348/294; 348/300; 257/225; 358/514; 358/483
[58] Field of Search ..................... 348/294, 295, 348/300, 311, 322, 324, 303, 304, 312; 377/60, 64, 75, 80; 257/215, 231, 225, 228, 229; 358/513, 514, 474, 482, 483; H04N 3/14, 5/335

[56] References Cited

U.S. PATENT DOCUMENTS

| | | | |
|---|---|---|---|
| 4,363,035 | 12/1982 | Lehmann | 358/213 |
| 4,453,187 | 6/1984 | Komiya et al. | 358/213.11 |
| 4,499,384 | 2/1985 | Segawa et al. | 250/578 |
| 4,573,079 | 2/1986 | Yamaguchi | 358/213.31 |
| 4,617,471 | 10/1986 | Suzuki et al. | 250/578 |
| 4,646,155 | 2/1987 | Miyazawa et al. | 358/213.29 |
| 4,672,453 | 6/1987 | Sakamoto | 358/294 |
| 4,691,114 | 9/1987 | Hasegawa et al. | 250/578 |
| 4,783,842 | 11/1988 | Fuwa | 382/67 |
| 4,835,404 | 5/1989 | Sugawa et al. | 250/578 |
| 4,868,405 | 9/1989 | Nakamura et al. | 250/578 |
| 4,875,099 | 10/1989 | Sakai et al. | 358/213.11 |
| 5,109,440 | 4/1992 | Kawahara et al. | 382/67 |
| 5,262,870 | 11/1993 | Nakamura et al. | 358/212 |

FOREIGN PATENT DOCUMENTS

| | | | |
|---|---|---|---|
| 0260956 | 3/1988 | European Pat. Off. | H04N 3/156 |
| 0292253 | 11/1988 | European Pat. Off. | H04N 1/18 |
| 61-214564 | 9/1986 | Japan | H01L 27/14 |
| 0128749 | 6/1988 | Japan | 358/213.29 |
| 2160058 | 12/1985 | United Kingdom | H04N 1/028 |

*Primary Examiner*—Safet Metjahic
*Attorney, Agent, or Firm*—Fitzpatrick, Cella, Harper & Scinto

[57] ABSTRACT

A sensor chip includes output signal lines for outputting signals outside the sensor chip from light-receiving elements of the sensor chip, a switch for connecting/disconnecting the output signal lines, and a controller for closing the switch only for a duration including a time interval in which signals are output outside the sensor chip from the light-receiving elements, and opening the switch for a duration except for the signal output duration. A multichip photoelectric conversion apparatus in which a plurality of sensor chips each having a plurality of light-receiving elements are arranged, includes output signal lines, connected to a common signal line, for outputting signals outside the sensor chip from light-receiving elements of the sensor chip, a switch, provided for each of the sensor chips, for connecting/disconnecting the output signal lines, and a controller, provided in each of the sensor chips, for closing the switch only for a duration including a time interval in which signals are output outside the sensor chip from the light-receiving elements, and opening the switch for a duration except for the signal output duration.

60 Claims, 8 Drawing Sheets

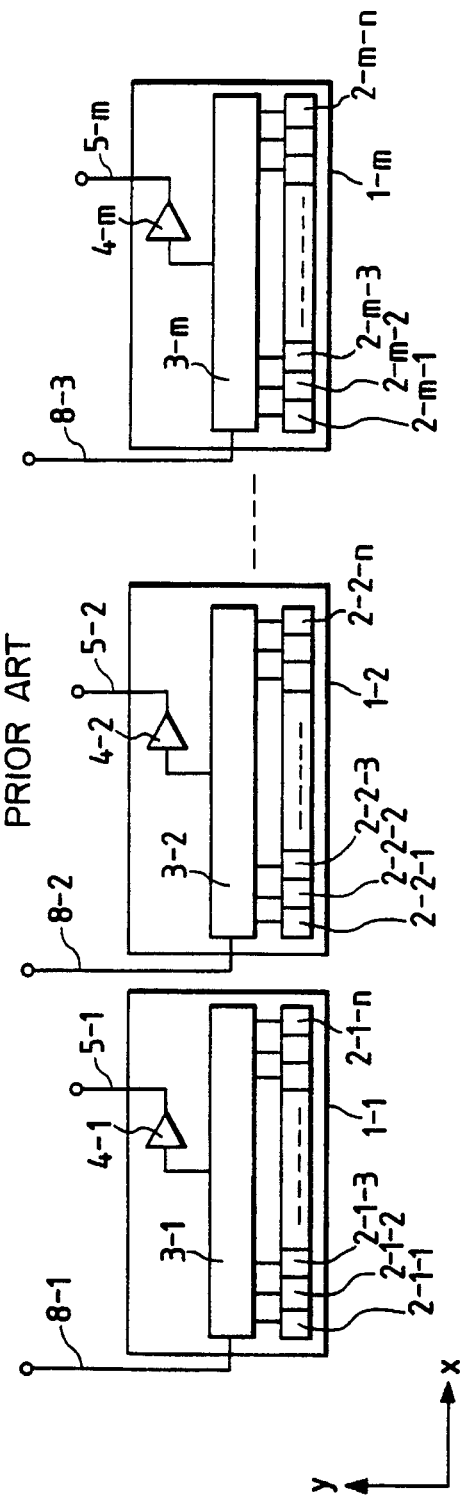
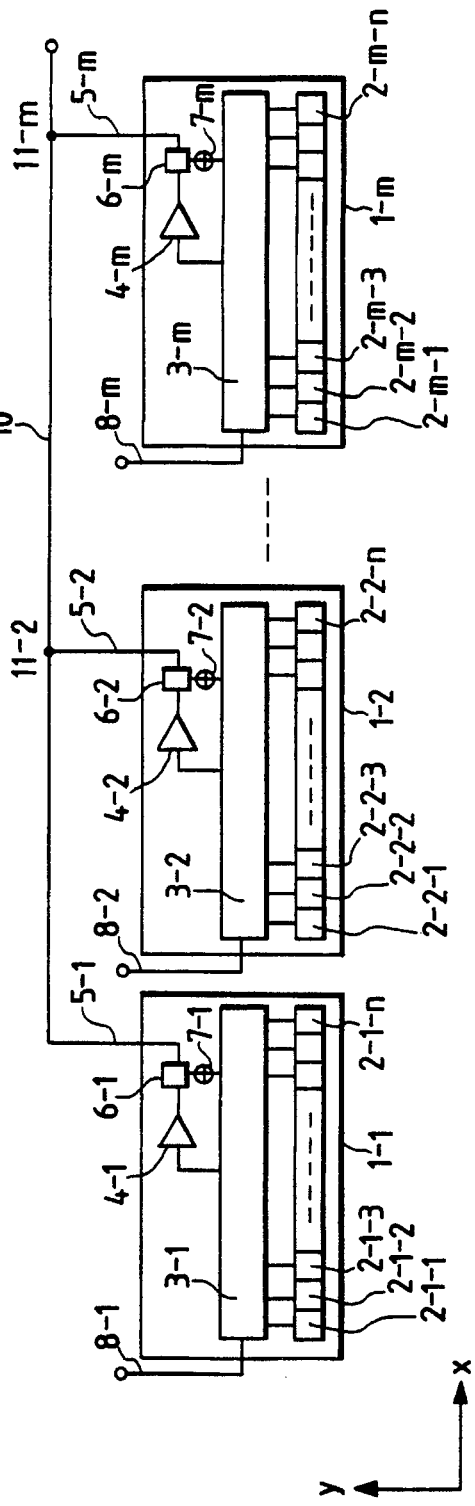

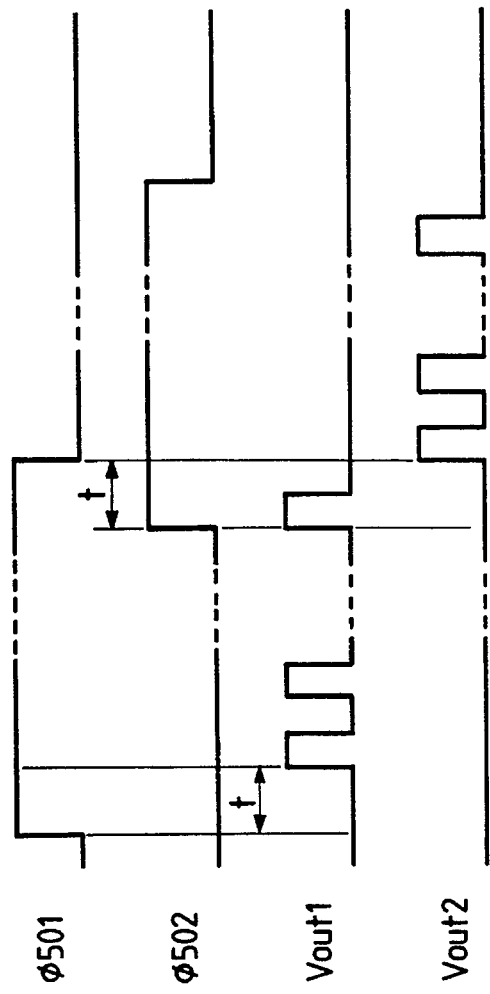

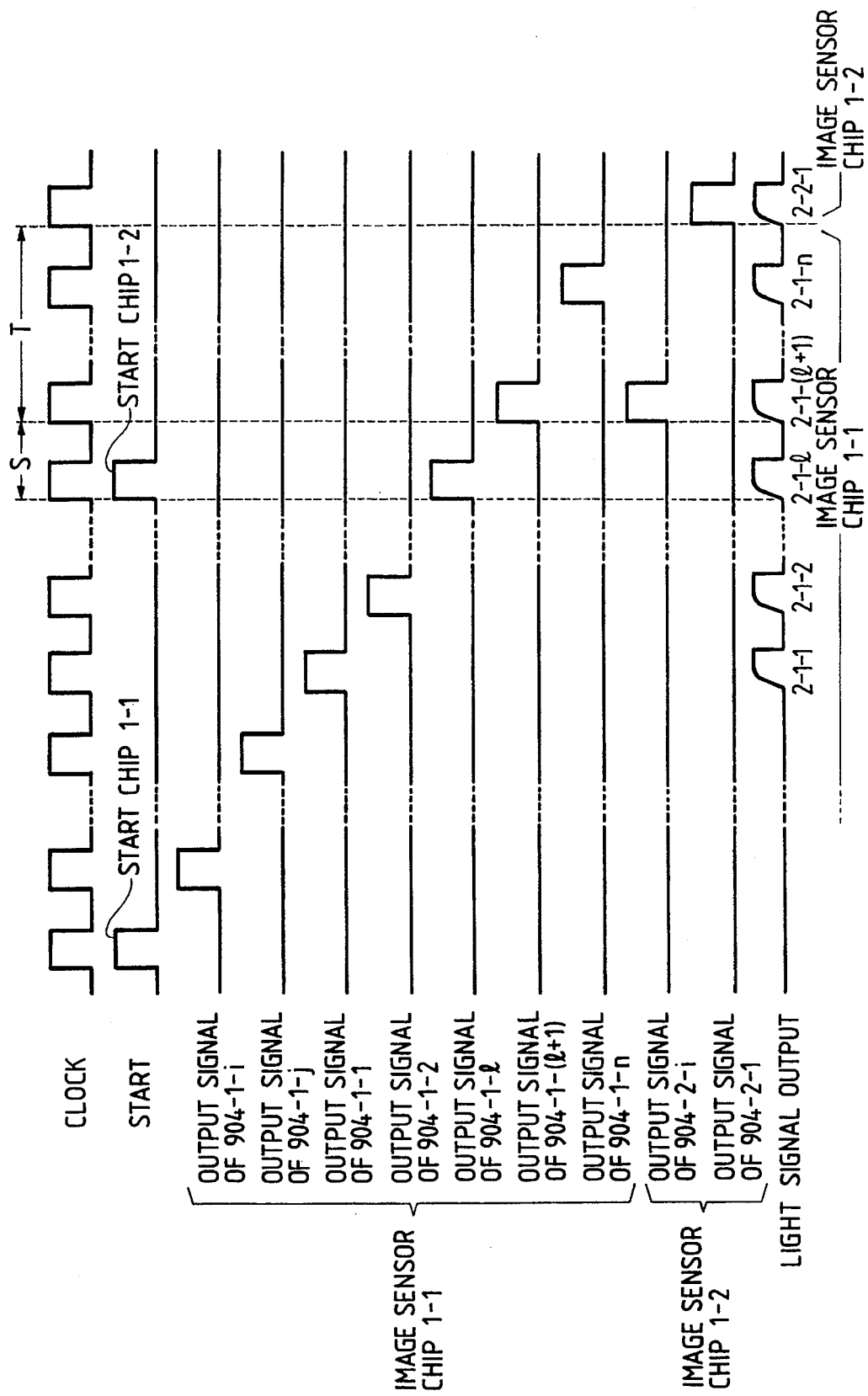

1

SENSOR CHIP AND PHOTO-ELECTRIC CONVERSION APPARATUS USING THE SAME

This application is a continuation of application Ser. No. 08/150,246 filed on Nov. 9, 1993, now abandoned, which is a continuation of prior application Ser. No. 07/994,446 filed on Dec. 23, 1992, now abandoned, which is a continuation of prior application Ser. No. 07/856,847 filed on Mar. 23, 1992, now abandoned, which is a continuation of prior application Ser. No. 07/476,767 filed on Feb. 8, 1990, which is now abandoned.

BACKGROUND OF THE INVENTION

1. Field of the Invention

The present invention relates to a sensor chip and a photoelectric conversion apparatus using the same and, more particularly, to a multichip photoelectric conversion apparatus using an array of a plurality of sensor chips.

2. Related Background Art

Conventionally, a photoelectric conversion apparatus (linear image sensor) in which light-receiving elements are arranged in a line has been widely used in an image reading apparatus such as a facsimile, a digital copying machine, and a scanner.

Since a sensor chip for use in a linear image sensor is generally made from a silicon wafer, the sensor length is limited by the wafer size. Therefore, it is difficult to manufacture a linear image sensor chip having a length identical to the width of an original to be read having a general size. For this reason, in order to use a single sensor chip, an imaging optical system is used to image an original to be read on the sensor chip in a reduced scale, thereby reading an image carried by the original. An apparatus utilizing such a reduction imaging optical system, however, requires a space for the optical system. Therefore, it is difficult to make the apparatus compact. In addition, it is difficult to obtain a sufficient resolution.

For this reason, a so-called multichip image sensor in which a plurality of linear image sensor chips are linearly arranged has been put into practical use.

FIG. 1 is a block diagram showing an arrangement of a conventional multichip image sensor.

Referring to FIG. 1, n light-receiving elements 2-1-1 to 2-1-n are formed in a line in the x direction on a sensor chip 1-1. A circuit 3-1 for sequentially selecting outputs from the light-receiving elements 2-1-1 to 2-1-n is formed on the chip 1-1. An amplifier 4-1 for amplifying an output from the circuit 3-1 is also formed on the chip 1-1. An output from the amplifier 4-1 is output outside the chip from an output line 5-1 generally via a signal extracting section.

The circuit 3-1 is driven by an external driver via an input line 8-1.

Sensor chips 1-2 to 1-m have the same arrangement as that of the sensor chip 1-1. In the sensor chips 1-2 to 1-m, therefore, the same reference numerals as in the sensor chip 1-1 denote the same parts.

The sensor chips 1-1 to 1-m are arranged in a line in the x direction. Therefore, a total of (n×m) light-receiving elements are arranged in a line in the x direction. Upon image reading, an original carrying an image to be read and/or a photoelectric conversion apparatus are conveyed in the y direction relative to each other so that the original faces the light-receiving elements.

Outputs from all light-receiving elements of the chip 1-1 are sequentially selected by the circuit 3-1 and externally output from the output line 5-1. Outputs from all light-receiving elements of the chip 1-2 are then sequentially selected by a circuit 3-2 and externally output from an output line 5-2. Subsequently, signals from light-receiving elements are similarly, sequentially read. As a result, outputs from all light-receiving elements are time-serially output.

In the conventional multichip image sensor as described above, since an output signal from each sensor chip is independently extracted to an external signal processor, the number of signal lines is increased to complicate the wiring. In order to solve this problem, a common signal line may be used to extract signals to the external signal processor. If, however, all sensor chips including those not externally outputting signals from light-receiving elements are connected to the output line, crosstalk between signals easily occurs to reduce an S/N ratio of a read signal.

In addition, in the above conventional multichip image sensor, an amplifier is in an operative state even while light-emitting elements of each chip do not externally output signals. For this reason, if the number of sensor chips is increased, unnecessary power consumption is increased or heat is generated to increase the chip temperature, thereby degrading the sensor characteristics.

SUMMARY OF THE INVENTION

The present invention has been made in consideration of the above conventional techniques and has as its object to provide a multichip photoelectric conversion apparatus in which a common signal line is used to extract signals from a plurality of sensor chips to an external signal processor and which causes almost no reduction in an S/N ratio of a read signal, and a sensor chip for constituting the photoelectric conversion apparatus.

It is another object of the present invention to provide a photoelectric conversion apparatus in which power consumption of a multichip photoelectric conversion apparatus is reduced to prevent degradation in sensor characteristics due to a temperature rise, and a sensor chip for constituting the photoelectric conversion apparatus.

It is still another object of the present invention to provide a multichip photoelectric conversion apparatus capable of increasing the frequency of a clock signal to reduce a read time, thereby performing high-speed read, without increasing the cost by using an external complicated circuit.

It is still another object of the present invention to provide a sensor chip which can be used in a multichip photoelectric conversion apparatus in which a plurality of sensor chips each having a plurality of light-receiving elements are arranged, comprising output signal lines for outputting signals outside the sensor chip from light-receiving elements of the sensor chip, a switch for connecting/disconnecting the output signal lines, and a controller for closing the switch only for a duration including a time interval in which signals are output outside the sensor chip from the light-receiving elements, and opening the switch for a duration except for the duration.

It is still another object of the present invention to provide a multichip photoelectric conversion apparatus in which a plurality of sensor chips each having a plurality of light-receiving elements are arranged, comprising output signal lines, connected to a common signal line, for outputting signals outside the sensor chip from light-receiving elements of the sensor chip, a switch, provided for each of the sensor chips, for connecting/disconnecting the output signal lines, and a controller, provided in each of the sensor chips, for closing the switch only for a duration including a time interval in which signals are output outside the sensor chip from the light-receiving elements, and opening the switch for a duration except for the signal output duration.

It is still another object of the present invention to provide a sensor chip which can be used in a multichip photoelectric conversion apparatus in which a plurality of sensor chips each having a plurality of light-receiving elements are arranged, comprising an amplifier for amplifying output signals from light-receiving elements of the sensor chip, and a controller for enabling the amplifier only for a duration including a time interval in which signals are output outside the sensor chip from the light-receiving elements, and disabling the amplifier for a duration except for the signal output duration.

It is still another object of the present invention to provide a multichip photoelectric conversion apparatus in which a plurality of sensor chips each having a plurality of light-receiving elements are arranged, comprising an amplifier, provided for each of the sensor chips, for amplifying output signals from the light-receiving elements, and a controller, provided in each of the sensor chips, for enabling the amplifier only for a duration including a time interval in which signals are output outside the sensor chip from the light-receiving elements, and disabling the amplifier for a duration except for the signal output duration.

It is still another object of the present invention to provide a sensor chip which can be used in a multichip photoelectric conversion apparatus in which a plurality of sensor chips each having a light-receiving element are arranged, comprising means for delaying a start signal for a light signal read operation performed by the light-receiving element, and means for outputting a signal used as a start signal for the next sensor chip before the light signal read operation is finished.

It is still another object of the present invention to provide a sensor chip having a plurality of light-receiving elements, comprising a circuit connected to each of the plurality of light-receiving elements, a signal extracting portion electrically connected to an output signal line for extracting a signal from the circuit outside the sensor chip, a controller for connecting/disconnecting a signal output from the circuit and from the signal extracting portion, and a signal line for operating the controller.

It is still another object of the present invention to provide a photoelectric conversion apparatus comprising a plurality of sensor chips described above, the signal extracting portions of the sensor chips being connected to a common signal line.

It is still another object of the present invention to provide a reading apparatus comprising a photoelectric conversion apparatus described above, a signal processor for receiving an output signal from the photoelectric conversion apparatus, and a driver for driving the photoelectric conversion apparatus.

It is still another object of the present invention to provide a sensor chip having a plurality of light-receiving elements, comprising a circuit connected to each of the plurality of light-receiving elements, a signal extracting portion electrically connected to an output signal line for extracting an output from the circuit outside the sensor chip, an amplifier for amplifying the output from the circuit, a controller for controlling an operation state of the amplifier, and a signal line for operating the controller.

It is still another object of the present invention to provide a photoelectric conversion apparatus comprising a plurality of sensor chips described above.

It is still another object of the present invention to provide a reading apparatus comprising a photoelectric conversion apparatus described above, a signal processor for receiving an output signal from the photoelectric conversion apparatus, and a driver for driving the photoelectric conversion apparatus.

It is still another object of the present invention to provide a method of reading a photoelectric conversion apparatus having a plurality of light-receiving elements, an amplifier for receiving outputs from the light-receiving elements, and a controller for controlling an operation state of the amplifier, comprising the steps of enabling at least an amplifier of an nth (n is an integer of 1 or more) sensor chip to be read, and enabling an amplifier of an (n+1)th sensor chip by a signal output on the basis of an operation of the nth sensor chip.

BRIEF DESCRIPTION OF THE DRAWINGS

FIG. 1 is a block diagram showing an arrangement of a conventional multichip image sensor;

FIG. 2 is a block diagram showing an arrangement of an embodiment of a photoelectric conversion apparatus according to the present invention;

FIG. 7 is a timing chart for explaining another operation of the embodiment shown in FIG. 5;

FIG. 8 is a block diagram showing still another embodiment of a photoelectric conversion apparatus according to the present invention;

FIG. 12 is a timing chart showing operation waveforms of the embodiment shown in FIG. 11.

DETAILED DESCRIPTION OF THE PREFERRED EMBODIMENTS

The present invention provides a sensor chip and a photoelectric conversion apparatus having the same capable of solving the above problems and achieving the above objects.

That is, according to the present invention, there is provided a photoelectric conversion apparatus having no crosstalk between signals upon signal read, and capable of performing signal read at a high S/N ratio and reducing power consumption to prevent degradation in sensor characteristics due to heat, thereby enabling high-speed reading, and a sensor chip for use in the apparatus.

Preferred embodiments of the present invention will be described in detail below with reference to the accompanying drawings.

FIG. 2 is a block diagram showing an arrangement of an embodiment of a photoelectric conversion apparatus according to the present invention.

Referring to FIG. 2, a sensor chip 1-1 consists of a semiconductor such as silicon. N light-receiving elements 2-1-1 to 2-1-n are formed in a line in the x direction on the chip 1-1. The light-receiving elements are of a type of storing optical pumping carriers in a control electrode region of a transistor and extracting an output corresponding to the stored charge as needed. That is, optical pumping carriers generated upon inputting of optical information are stored in the base region of a transistor to store a charge corresponding to the optical input information, and an output corresponding to the stored charge is extracted as an electrical output signal as needed. In this type, the stored charge can be basically nondestructively read. When the stored charge becomes unnecessary, it is generally refreshed by a certain means (not shown). The light-receiving element need not be of this type but may be of another type. A circuit 3-1 (e.g., a shift register) for sequentially selecting outputs from the light-receiving elements 2-1-1 to 2-1-m is formed on the chip 1-1. An amplifier 4-1 for amplifying an output from the circuit 3-1 is formed on the chip 1-1.

In this embodiment, an analog switch 6-1 for connecting/disconnecting an output signal line 5-1 of the amplifier 4-1 and a controller 7-1 for controlling a switching operation of the switch are formed on the chip 1-1. The controller 7-1 outputs a control signal on the basis of a signal from the circuit 3-1. The circuit 3-1 is driven by an external driver via an input line 8-1.

Figure 3A:
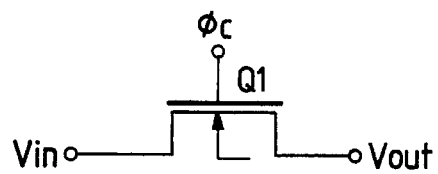
FIGS. 3A, 3B and 3C are circuit diagrams showing detailed arrangements of an analog switch.
Figure 3B:
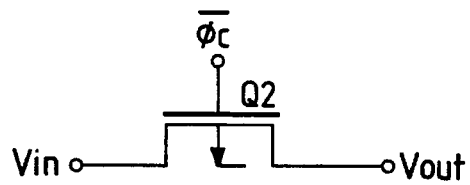
Figure 3C:
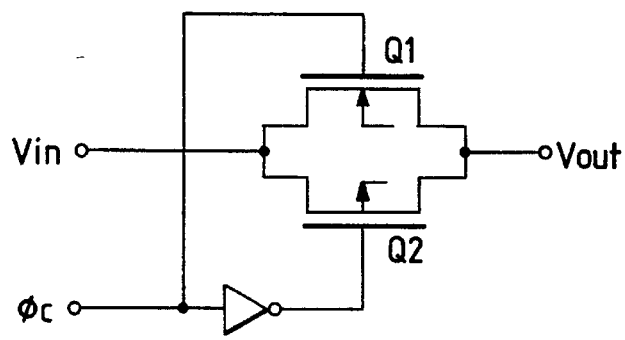

FIGS. 3A, 3B and 3C are circuit diagrams showing detailed arrangements of the analog switch 6-1.

Referring to FIG. 3A, passing of a signal Vin as an output from the amplifier 4-1 to Vout is controlled by a control signal $\phi c$ supplied from the controller 7-1 to the gate of an n-type MOS transistor $Q_1$.

Referring to FIG. 3B, passing of a signal Vin as an output from the amplifier 4-1 to Vout is controlled by a control signal $\overline{\phi c}$ supplied from the controller 7-1 to the gate of a p-type MOS transistor $Q_2$.

Referring to FIG. 3C, the sources and the drains of an n-type MOS transistor $Q_1$ and a p-type MOS transistor $Q_2$ are commonly connected. A control signal $\phi c$ is directly supplied to the gate of the transistor $Q_1$, while it is supplied to the gate of the transistor $Q_2$ via an inverter, thereby controlling passing of a signal Vin as an output from the amplifier 4-1 to Vout. This arrangement is a C-MOS type gate.

Although FIGS. 3A to 3C show analog switches using a MOS transistor, an analog switch having the same function can be constituted by using a bipolar transistor.

Referring to FIG. 2, sensor chips 1-2 to 1-m have the same arrangement as that of the sensor chip 1-1, and the same reference numerals as in the sensor chip 1-1 denote the same parts in the sensor chips 1-2 to 1-m.

Output lines 5-1 to 5-m of the sensor chips are connected to a common signal line 10 outside the chips generally via signal extracting portions 11-1 to 11-m. These sensor chips are connected to an external signal processor via the signal line.

The sensor chips 1-1 to 1-m are arranged in a line in the x direction. Therefore, a total of (n×m) light-receiving elements are arranged in a line in the x direction. All the sensor chips are arranged and fixed on a substrate (not shown). Upon image reading, an original carrying an image to be read and/or the light-receiving elements are conveyed relative to each other in the y direction so that the original faces the light-receiving elements.

An operation of this embodiment will be described below.

Figure 4:
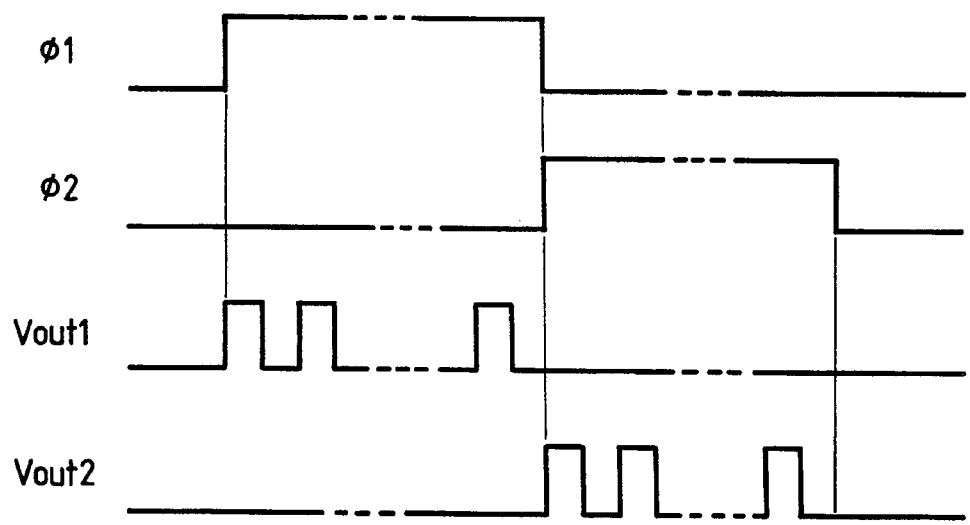
FIG. 4 is a timing chart for explaining an operation of the embodiment shown in FIG. 2.

FIG. 4 is a timing chart for explaining an operation of the above embodiment.

Referring to FIG. 4, an output control signal $\phi_1$ is supplied from the controller 7-1 of the sensor chip 1-1, an output control signal $\phi_2$ is supplied from the controller 7-2 of the sensor chip 1-2, and outputs Vout$_1$ and Vout$_2$ are supplied from the switches 6-1 and 6-2 of the sensor chips 1-1 and 1-2, respectively.

The signal $\phi_1$ is synchronized with an operation of the circuit 3-1 driven by the input line 8-1. That is, the signal $\phi_1$ is output only for a specific duration including a time interval in which the outputs from all the light-receiving elements of the chip 1-1 are sequentially selected by the circuit 3-1. Only for this duration, the switch 6-1 is closed, and Vout$_1$ is output. The output Vout$_1$ includes the outputs from all the light-receiving elements of the sensor chip 1-1.

Similarly, the signal $\phi_2$ is synchronized with an operation of the circuit 3-2 driven by the input line 8-2. That is, the signal $\phi_2$ is output only for a specific duration including a time interval in which outputs from all the light-receiving elements of the chip 1-2 are sequentially selected by the circuit 3-2. Only for this duration, the switch 6-2 is closed, and Vout$_2$ is output. The output Vout$_2$ includes the outputs from all the light-receiving elements of the sensor chip 1-2.

As shown in FIG. 4, the duration of the signal $\phi_2$ starts at the same time as the duration of the signal $\phi_1$ ends.

Output control signals are similarly generated from the controllers 7-2 to 7-m of the third and subsequent sensor chips 1-3 to 1-m, respectively.

As described above, signals are sequentially read from the light-receiving elements, and outputs from the light-receiving elements are time-serially output from the common output line 10.

In this embodiment, in each sensor chip, an output from the amplifier is connected to the common output line 10 only for the duration substantially corresponding to the time interval in which signals are output from the light-receiving elements, and is disconnected therefrom for a duration except for the above signal output duration. Therefore, no crosstalk occurs during signal reading to reduce the S/N ratio of the read signal.

According to this embodiment, since switching can be automatically set and no wiring is provided for the controller or the switch of each chip from an external driver, an external circuit can be simplified.

Another embodiment of the present invention will be described in detail below with reference to the accompanying drawings.

Figure 5:
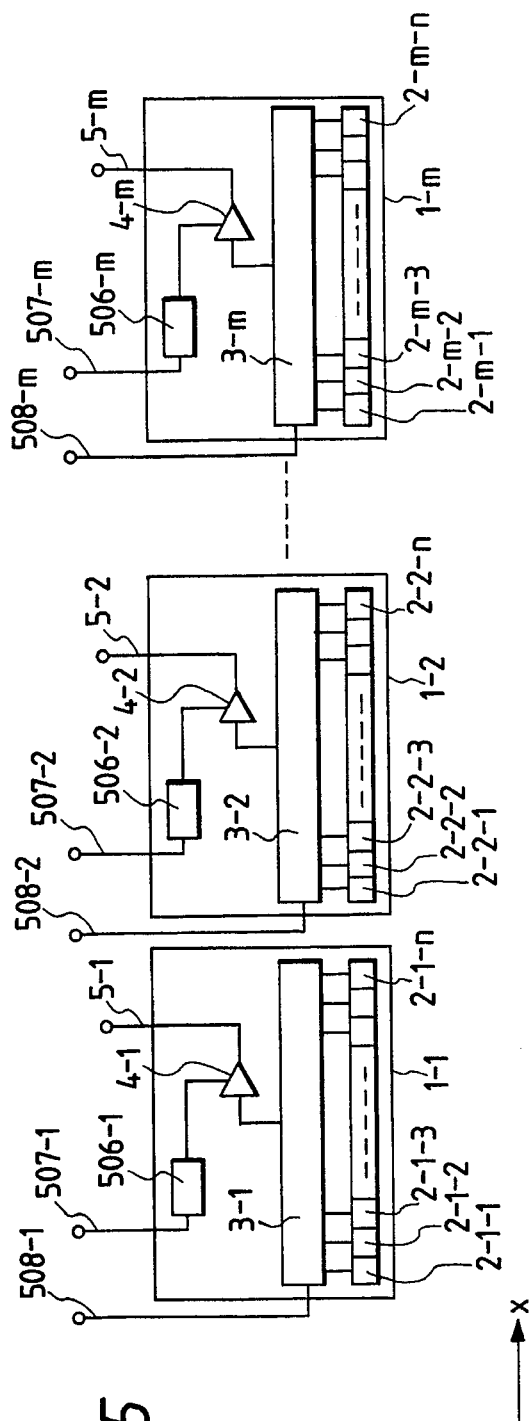
FIG. 5 is a block diagram showing an arrangement of another embodiment of a photoelectric conversion apparatus according to the present invention.

FIG. 5 is a block diagram showing an arrangement of another embodiment of a photoelectric conversion apparatus of the present invention.

Referring to FIG. 5, a sensor chip 1-1 consists of a semiconductor such as silicon. N light-receiving elements 2-1-1 to 2-1-n are formed in a line in the x direction on the chip. The light-receiving elements are of a type of storing optical pumping carriers in a control electrode region of a transistor and extracting an output corresponding to the stored charge as needed. That is, the type used in the first embodiment is adopted. A circuit 3-1 such as a shift register for sequentially selecting outputs from the light-receiving elements 2-1-1 to 2-1-n is formed on the chip 1-1. An amplifier 4-1 for amplifying an output from the circuit 3-1 is formed on the chip 1-1. An output from the amplifier 4-1 is externally output from an output line 5-1 generally via a signal extracting portion. This output is generally supplied to a signal processor and processed as needed.

In this embodiment, a controller 506-1 for outputting a switching control signal for switching operative and nonoperative states of the amplifier 4-1 is formed on the chip 1-1. The controller 506-1 is driven by an external driver via an input line 507-1. The circuit 3-1 is also driven by an external driver via an input line 508-1.

Sensor chips 1-2 to 1-m have the same arrangement as that of the sensor chip 1-1, and the same reference numerals as in the sensor chip 1-1 denote the same parts in the sensor chips 1-2 to 1-m.

The sensor chips 1-1 to 1-m are arranged in a line in the x direction. Therefore, a total of (n×m) light-receiving elements are arranged in a line in the x direction. All the sensor chips are arranged and fixed on a substrate (not shown). Upon image reading, an original carrying an image to be read and/or the photoelectric conversion apparatus are conveyed relative to each other in the y direction so that the original faces the light-receiving elements.

An operation of this embodiment will be described below.

Figure 6:
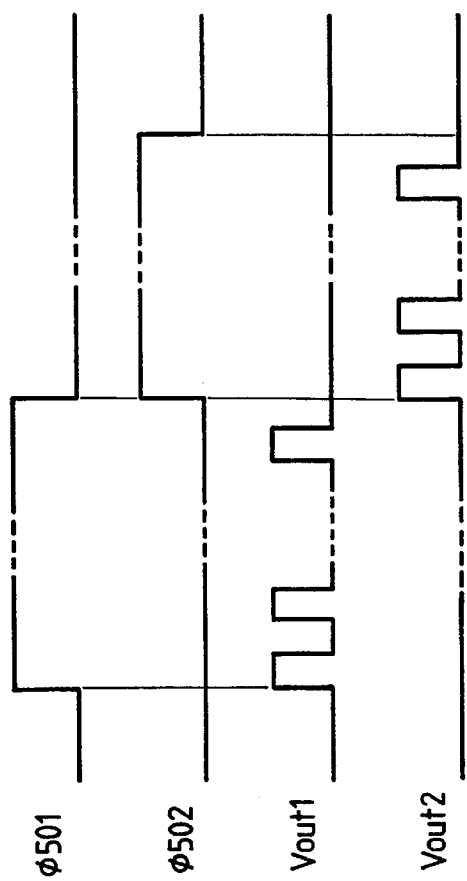
FIG. 6 is a timing chart for explaining an operation of the embodiment shown in FIG. 5.

FIG. 6 is a timing chart for explaining an operation of the above embodiment.

Referring to FIG. 6, an output control signal $\phi_{501}$ is supplied from the controller 506-1 of the sensor chip 1-1, an output control signal $\phi_{502}$ is supplied from the controller 506-2 of the sensor chip 1-2, and outputs Vout$_1$ and Vout$_2$ are supplied from the amplifiers 4-1 and 4-2 of the sensor chips 1-1 and 1-2, respectively.

The signal $\phi_{501}$ is synchronized with an operation of the circuit 3-1 driven by the input line 508-1. That is, the signal $\phi_{501}$ is output only for a specific duration including a time interval in which outputs from all the light-receiving elements of the chip 1-1 are sequentially selected by the circuit 3-1. Only for this duration, the amplifier 4-1 is operated, and Vout$_1$ is output. The output Vout$_1$ includes the outputs from all the light-receiving elements of the sensor chip 1-1.

Similarly, the signal $\phi_{502}$ is synchronized with an operation of the circuit 3-2 driven by the input line 508-2. That is, the signal $\phi_{502}$ is output only for a specific duration including a time interval in which outputs from all the light-receiving elements of the chip 1-2 are sequentially selected by the circuit 3-2. Only for this duration, the amplifier 4-2 is operated, and Vout$_2$ is output. The output Vout$_2$ includes the outputs from all the light-receiving elements of the sensor chip 1-2.

As shown in FIG. 6, the duration of the signal $\phi_{502}$ starts at the same time as the duration of the signal $\phi_{501}$ ends.

Output control signals are similarly generated from the controllers 506-3 to 506-m of the third and subsequent sensor chips 1-3 to 1-m, respectively.

As described above, signals are sequentially read from the light-receiving elements, and outputs from all the light-receiving elements are time-serially output.

In this embodiment, in each sensor chip, the amplifier is operated only for the duration substantially corresponding to the time interval in which signals are output from the light-receiving elements and is not operated for a duration except for the above signal output duration. Therefore, consumption power of the amplifiers 4-1 to 4-m is reduced to be 1/m conventional consumption power.

FIG. 7 is a timing chart for explaining another operation of the above embodiment. In FIG. 7, the same reference numerals as in FIG. 6 are used.

As shown in FIG. 7, a control signal $\phi_{501}$ of the first sensor chip and a control signal $\phi_{502}$ of the second sensor chip overlap each other by a time t. The signals $\phi_{501}$ and $\phi_{502}$ are activated slightly before (by the time t) the first light-receiving element is selected by the selecting circuit in each sensor chip. This also applies to the third and subsequent sensor chips.

As described above, the control signal is started slightly before the first light-receiving element of each sensor chip is read. Therefore, a time required for starting and stabilizing an operation of each amplifier is assured, and signals from all the light-receiving elements including the first light-receiving element can be stably output with high precision in each sensor chip. In addition, since the overlap time of the control signals is sufficiently short with respect to the total time, the consumption power is not much increased from that of the operation shown in FIG. 6.

FIG. 8 is a block diagram showing an arrangement of still another embodiment of a photoelectric conversion apparatus of the present invention. In FIG. 8, the same reference numerals as in FIG. 5 denote the same parts.

This embodiment is the same as that shown in FIG. 5 except that controllers 506-1 to 506-m are controlled by control signals from circuits 3-1 to 3-m, respectively, in sensor chips.

That is, in correspondence with a time interval in which an operation command signal for sequentially selecting outputs from all the light-receiving elements of each chip is supplied from one of input lines 508-1 to 508-m to a corresponding one of the circuits 3-1 to 3-m, the circuit supplies a signal to the controller, thereby switching operative and nonoperative states of the amplifier as in the embodiment shown in FIG. 5.

According to this embodiment, unlike the embodiment shown in FIG. 5, the operative and nonoperative states of the amplifier can be automatically switched, and no external driver having an output for the amplifier need be used. In addition, unlike the first embodiment, no wirings 507-1 to 507-m need be provided from the external driver to the controllers of the respective chips. As a result, the external circuit can be simplified.

Switching between the operative and nonoperative states of the amplifier and connection/disconnection of the outputs can be simultaneously performed.

In this case, crosstalk and the consumption power can be further reduced.

Figure 9:
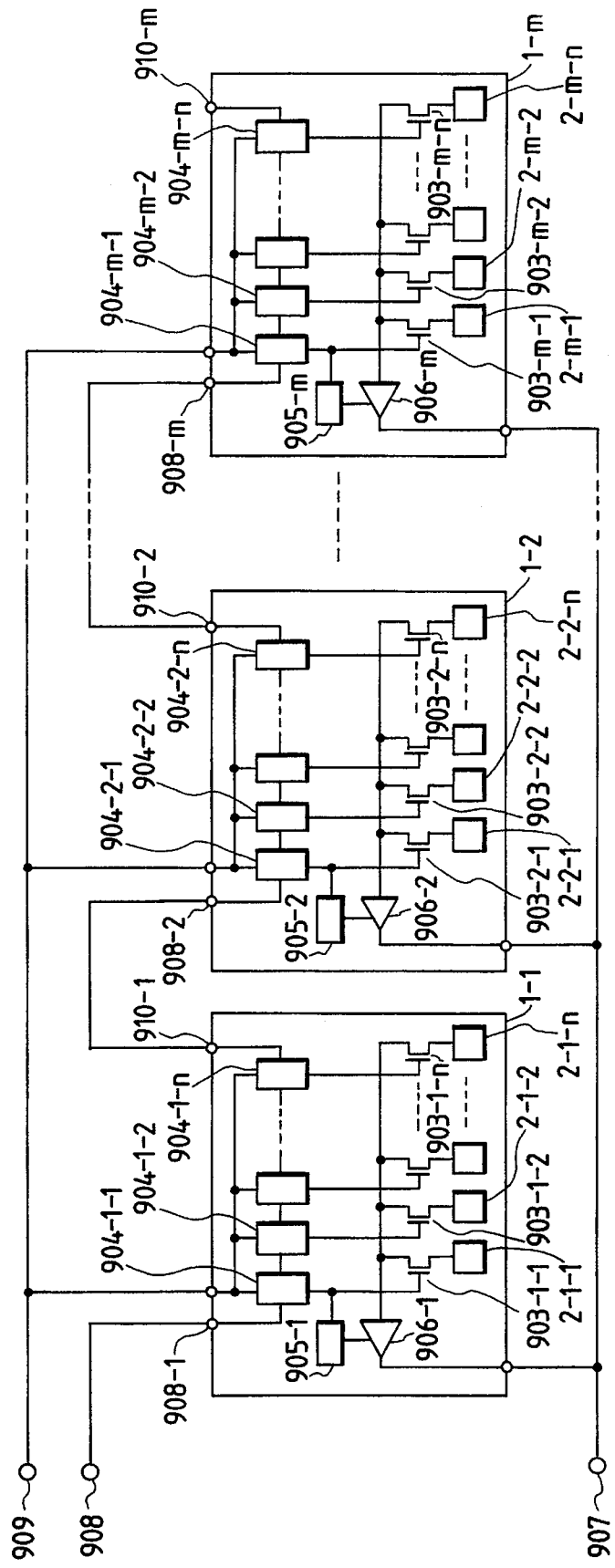
FIG. 9 is a block diagram showing an arrangement of a multichip image sensor.
Figure 10:
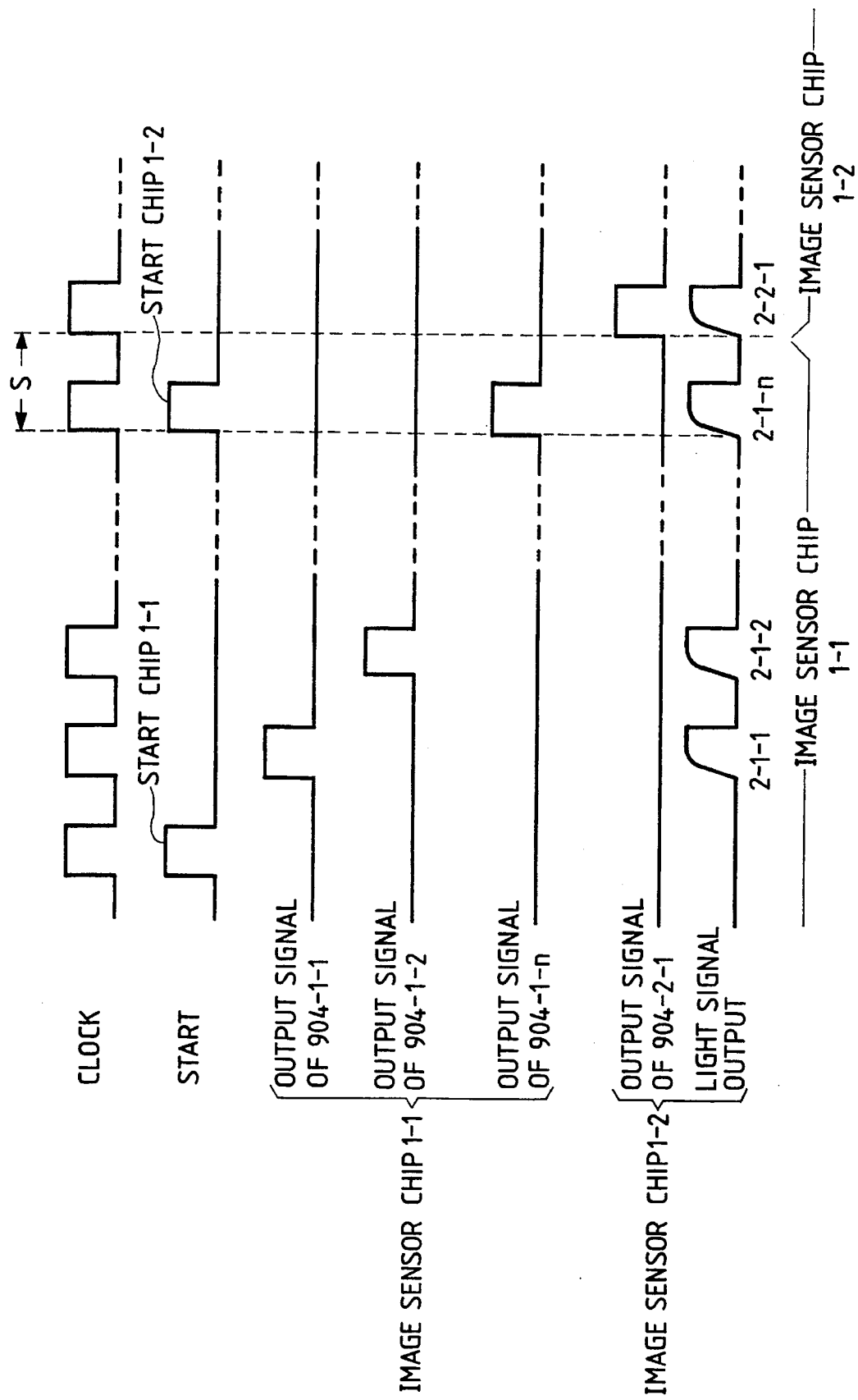
FIG. 10 is a timing chart showing operation waveforms of the sensor shown in FIG. 9.

FIG. 9 shows an arrangement of a multichip image sensor using an image sensor chip, and FIG. 10 shows operation waveforms (timing chart) thereof.

Referring to FIG. 9, image sensor chips (to be sometimes referred to as merely "chips" hereinafter) 1-1, 1-2, . . . , 1-m are connected to constitute a multichip image sensor. Light-receiving elements 2-1-1 to 2-1-n are formed on the image sensor chip 1-1 and convert input light signals into electrical signals. Since the light-receiving elements 2-1-1 to 2-m-n are arranged and connected in this multichip image sensor, the sensor length of this image sensor is long enough to correspond to a large original size.

This multichip sensor starts its operation when a start signal is supplied from a start terminal 908 to the first chip 1-1 in synchronism with a clock signal from a clock terminal 909. Upon reception of this start signal, shift registers 904-1-1 to 904-1-n sequentially turn on MOS switches 903-1-1 to 903-1-n to activate the light-receiving elements 2-1-1 to 2-1-n connected to the MOS switches, thereby reading a light signal.

This light signal is amplified by a light signal output amplifier 906-1 and output to an output terminal 907 as an optical output signal.

A controller 905-1 switches operative and nonoperative states of a constant current circuit of the light signal output amplifier 906-1. The controller 905-1 activates the constant current circuit substantially at the same time as the first shift register 4-1-1 receives the start signal, thereby activating the light signal output amplifier 906-1.

An output from the last shift register 904-1-n of the chip 1-1 turns on the last MOS switch 903-1-n and is externally output to be supplied as a start signal to the first shift register 904-2-1 of the next chip 1-2.

In the next chip 1-2, the same operation as in the chip 1-1 described above is performed, and a start signal is output to the next chip 1-3 (not shown). In this manner, the start signal is sequentially output to the next chip to execute a reading operation of a light signal having the sensor length.

FIG. 10 shows operation waveforms (timing chart) of the above multichip image sensor. Referring to FIG. 10, a light signal of the light-receiving element 2-2-1 is read a time S after a start signal is output to the chip 1-2. Therefore, the chip 1-2 must activate the constant current circuit of the amplifier within the time S. In addition, since the time S is shortened when a clock frequency is increased, the constant current circuit must be activated within a short time period.

As described above, light signal read from the light-receiving element 2-1-1 upon inputting of the start signal and activation of the constant current circuit of the light signal output amplifier 906-1 are performed at substantially the same time. Therefore, in order to read the light signal after the constant current circuit is completely activated, the frequency of a block signal must be decreased to sufficiently increase the read time of the light-receiving element per pixel.

When the frequency of a clock signal is increased to reduce the read time to achieve high-speed processing, the constant current circuit sometimes cannot be perfectly activated. That is, a light signal from the light-receiving element is output before the light signal output amplifier 906-1 is perfectly set in the operative state, and accurate signal amplification is disabled.

In order to solve this problem, the frequency of a clock signal for the first light-receiving element of each chip may be reduced. In this case, however, a complicated circuit must be externally provided to increase the cost.

Therefore, even if the frequency of a clock signal is increased in order to reduce the read time of a light signal of the multichip image sensor to achieve high-speed read, this increase is limited by the activation time of the constant current circuit.

Still another embodiment in which a constant current circuit of a light signal amplifier is activated beforehand to solve this problem will be described below with reference to the accompanying drawings. This method can be applied to the above embodiment.

Figure 11:
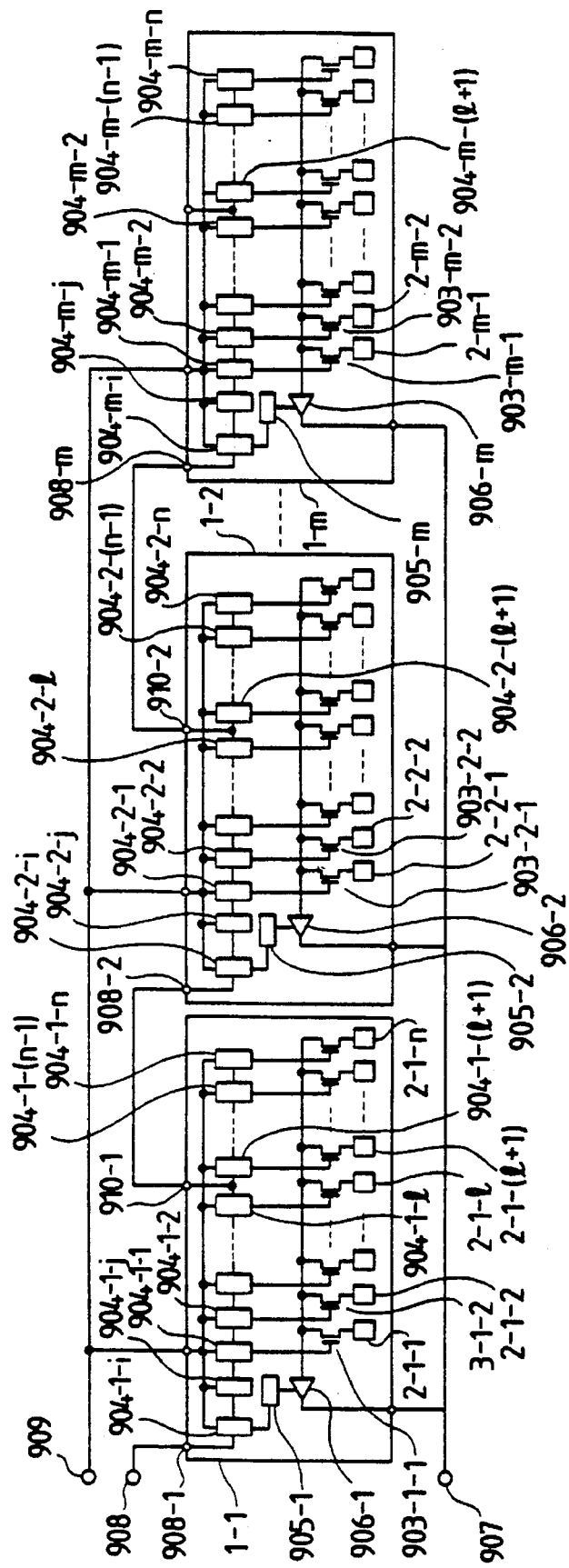
FIG. 11 is a block diagram showing an arrangement of a multichip image sensor as still another embodiment of an image sensor chip and a photoelectric conversion apparatus using the same according to the present invention.

FIG. 11 is a block diagram showing an arrangement of a multichip image sensor as an embodiment of an image sensor chip according to the present invention and a photoelectric conversion apparatus using the same.

Referring to FIG. 11, in image sensor chips 1-1, 1-2, ... , 1-m, the same reference numerals as in FIG. 9 denote the same parts. First (from the left in FIG. 11) shift registers 904-1-i, 904-1-j, 904-2-i, 904-2-j, ... , 904-m-i, and 904-m-j of the respective chips delay start signals.

A sensor operation of the multichip image sensor according to this embodiment is performed as follows. That is, after light signals are stored, a clock signal is supplied from a clock terminal 909 to each chip, and a start signal is supplied from a start terminal 908 to the first chip 1-1. This start signal is supplied to a controller 905-1 via a delay shift register 904-1-i. The controller 905-1 turns on a constant current circuit (not shown) of a light signal output amplifier 906-1. As a result, the light signal output amplifier 906-1 is enabled. The start signal is also supplied to the shift register 904-1-1 via the delay shift register 904-1-j and turns on a light-receiving element switching MOS switch 903-1-1. As a result, a light signal is read from the light-receiving element 2-1-1, amplified by the light signal output amplifier 906-1, and output to an output terminal 907. Subsequently, the light signal read operation is sequentially performed up to the light-receiving element 2-1-n in synchronism with the clock signal via the shift registers.

During this read operation to be sequentially executed, an output signal from the shift register 904-1-l is externally output from the chip 1-1 and used as a start signal for the next chip 1-2 at the same time the light-receiving element 2-1-l is read.

The start signal received by the next chip 1-2 is supplied to a controller 905-2 via the delay register 904-2-i. As a result, the controller 905-2 turns on a constant current circuit of a light signal output amplifier 906-2 beforehand.

Thereafter, in the chip 1-1, shift registers 904-1-(l+1) to 904-1-n are activated by a clock signal to read the remaining light-receiving elements 2-1-(l+1) to 2-1-n, respectively.

At the same time, in the chip 1-2, a read operation for the light-receiving element 2-2-1 is delayed by the delay shift registers 904-2-i and 904-2-j. This delay operation ends at the same time as the read operation of the chip 1-1 ends. The MOS switch 903-2-1 is turned on by the shift register 904-2-1, and reading of a light signal of the light-receiving element 2-2-1 is started. At this time, since a constant current circuit of the light signal output amplifier 906-2 of the chip 1-2 can satisfactorily operate, accurate signal amplification can be executed.

In this embodiment as described above, an operation time from the shift registers 904-1-l to 904-1-n of the chip 1-1 and an operation time from the delay shift registers 904-2-i to 904-2-j of the chip 1-2 are adjusted such that the read operation of the chip 1-2 is started immediately after the read operation of the chip 1-1 is ended. In addition, a time enough for activating the constant current circuit of the chip 1-2 is assured.

FIG. 12 shows operation waveforms (timing chart) for explaining the above operation of this embodiment. Referring to FIG. 12, the start signal for the chip 1-2 is output simultaneously with the output signal from the shift register 904-1-l of the chip 1-1, thereby activating the constant current circuit of the chip 1-2 (not shown). The start signal is delayed by a time T by the shift register 904-2-i and the shift register 904-2-j (not shown). Thereafter, the shift register 904-2-1 reads a light signal output from the light-receiving element 2-2-1. Even if the clock frequency is increased, accurate light signal amplification can be performed since the time T is designed to be a time enough for activating the constant current circuit.

In this embodiment, the shift registers are arranged in a line in correspondence with the light-receiving elements. The shift registers, however, can be arranged in any place of the chip as long as the wiring can be made.

As has been described above, according to the present invention, there is provided a multichip photoelectric conversion apparatus in which a common signal line is used to extract signals from a plurality of sensor chips to an external signal processor without generating crosstalk or reducing an S/N ratio of a read signal. In addition, switching can be effectively, automatically set to simplify an external circuit.

According to the present invention, consumption power of a multichip photoelectric conversion apparatus can be largely reduced without externally providing a specific circuit. In addition, heat generated on the basis of the consumption power can be reduced to prevent degradation in characteristics.

Furthermore, according to the present invention, each chip constituting a multichip image sensor comprises means for outputting a start signal to the next chip during a read operation of a light signal, and means for activating a light signal amplifier (e.g., a constant current circuit) upon inputting of the start signal and delaying the read operation until the read operation of the previous chip is perfectly finished. Therefore, even if a clock frequency is increased, the amplifier of each chip can be activated beforehand. As a result, a high-speed reading operation and an accurate light signal output can be obtained.

Moreover, since a shift register is used as the delay means, no complicated circuit need be externally arranged. Therefore, a compact photoelectric conversion apparatus as a multichip image sensor can be realized with high reliability and low cost.

What is claimed is:

1. A sensor chip for use in a multichip photoelectric conversion apparatus having a plurality of sensor chips disposed in an array, said chip comprising:

a plurality of light-receiving elements;

an output signal line common to the plurality of light receiving elements for outputting a signal from the plurality of light-receiving elements of the sensor chip to outside of the sensor chip;

an amplifier coupled to said plurality of light receiving elements;

a first switch provided between said output signal line and an output of said amplifier, for electrically switching said output signal line, said first switch being provided at a final stage of the chip; and a control circuit outputting a signal for closing said first switch for a first duration for outputting the signal from the light-receiving elements to the outside of the sensor chip, and for opening said first switch for a second duration other than the first duration, said control circuit comprising a shift register for outputting the signal from the light-receiving elements continuously and selectively.

2. A chip according to claim 1, wherein each light-receiving element is of a type of storing optical pumping carriers in a control electrode region of a transistor.

3. A sensor chip for use in a multichip photoelectric conversion apparatus having a plurality of sensor chips disposed in an array, said chip comprising:

a plurality of light-receiving elements;

an output signal line common to the plurality of light-receiving elements for outputting a signal from the plurality of light-receiving elements of the sensor chip to outside of the sensor chip;

a first switch disposed between said output signal line and the light-receiving elements for electrically switching said output signal line, said first switch being provided at a final stage of the chip;

a control circuit outputting a signal for closing said first switch for a first duration for outputting the signal from the light-receiving elements to the outside of the sensor chip, and for opening said first switch for a second duration other than the first duration; and a circuit for outputting a signal for sequentially selecting the light-receiving elements to drive a signal therefrom, and for operating said control circuit.

4. A chip according to claim 3, wherein each light-receiving element comprises a type which stores optical pumping carriers in a control electrode region of a transistor.

5. A sensor chip for use in a multichip photoelectric conversion apparatus having a plurality of sensor chips disposed in an array, said chip comprising:

a plurality of light-receiving elements;

an output signal line for outputting a signal from the plurality of light-receiving elements of the sensor chip to outside of the sensor chip;

a first switch disposed between said output signal line and the light-receiving elements for electrically switching said output signal line, said first switch being provided at a final stage of the chip;

a control circuit outputting a signal for closing said first switch for a first duration for outputting the signal from the light-receiving elements to the outside of the sensor chip, and for opening said first switch for a second duration other than the first duration; and a circuit for outputting a signal for sequentially selecting the light-receiving elements to drive a signal therefrom, and for operating said control circuit, further comprising a common amplifier, and a second switch provided for an output signal line of said amplifier, wherein an output from said circuit is supplied to said common amplifier.

6. A chip according to claim 3, wherein the plurality of light-receiving elements are linearly arranged in each sensor chip, and wherein the sensor chips are arranged in an array direction of the light-receiving elements.

7. A sensor chip for use in a multichip photoelectric conversion apparatus having a plurality of sensor chips disposed in an array, said chip comprising:

a plurality of light-receiving elements;

an output signal line common to the plurality of light-receiving elements for outputting a signal from the plurality of light-receiving elements of the sensor chip to outside of the sensor chip;

a first switch provided between said output signal line and the light-receiving elements, for electrically switching said output signal line, said first switch being provided at a final stage of the chip;

a controller outputting a signal for closing said first switch for a first duration for outputting the signal from the light-receiving elements to the outside of the sensor chip, and for opening said first switch for a second duration other than the first duration; and a circuit for outputting a signal for sequentially selecting the light-receiving elements to drive a signal therefrom, and for operating said controller, wherein an output from said circuit is supplied to a common amplifier, and a second switch is provided for an output signal line of said amplifier.

8. A chip according to claim 7, wherein each light-receiving element comprises a type which stores optical pumping carriers in a control electrode region of a transistor.

9. A chip according to claim 7, wherein the plurality of light-receiving elements are linearly arranged in each sensor chip, and wherein the sensor chips are arranged in an array direction of the light-receiving elements.

10. A multichip photoelectric conversion apparatus in which a plurality of sensor chips each having a plurality of light-receiving elements are arranged, comprising:

an output signal line, provided for each sensor chip and coupled to an external signal line which is common to said plurality of sensor chips, for outputting a signal from the light-receiving elements of each sensor chip to the common signal line outside of the sensor chip;

a switch, provided for each of the sensor chips and provided between said output signal line and the light receiving elements for electrically switching said output signal line, said switch being provided at a final stage of the chip; and a control circuit, provided in each of the sensor chips, for outputting a signal for closing said switch for a first duration, for outputting the signal from the light-receiving elements to the outside of the sensor chip, and for opening said switch for a second duration other than the first duration, said control circuit comprising a shift register for outputting the signal from the light-receiving elements continuously and selectively.

11. An apparatus according to claim 10, wherein the plurality of light-receiving elements are linearly arranged in each sensor chip, and the sensor chips are arranged in an array direction of the light-receiving elements.

12. A sensor chip for use in a multichip photoelectric conversion apparatus having a plurality of sensor chips, said chip comprising:

a plurality of light-receiving elements;

an amplifier, commonly coupled to the plurality of light-receiving elements, for amplifying an output signal from the light-receiving elements; and a control circuit for outputting a signal to said amplifier that activates said amplifier for a first duration in which a signal is to be outputted from the light receiving elements to outside of the sensor chip, and for not outputting the signal that activates said amplifier for a second duration other than the first duration.

13. A chip according to claim 12, wherein each light-receiving element is of a type storing optical pumping carriers in a control electrode region of a transistor.

14. A chip according to claim 12, further comprising a circuit for outputting a signal for sequentially selecting the light-receiving elements to derive a signal from each of the light receiving elements to input into said amplifier, and for activating said control circuit.

15. A chip according to claim 12, further comprising delay means for causing a start timing of the first duration to be prior to a timing at which the signal from the light receiving elements is outputted to outside of the sensor chip.

16. A sensor chip according to claim 14, wherein said circuit for sequentially selecting the light receiving elements comprises a shift register.

17. A sensor chip according to claim 15, wherein said delaying means comprises a shift register.

18. A multichip photoelectric conversion apparatus in which a plurality of sensor chips each having a plurality of light-receiving elements are arranged, comprising:

an amplifier, provided on each of the sensor chips and coupled commonly to the respective plurality of light receiving elements, for amplifying output signals from the light-receiving elements; and a control circuit provided on each said sensor chip for outputting a signal to activate said amplifier for a first duration in which a signal is to be outputted from the light receiving elements to outside of the sensor chip, and for deactivating said amplifier for a second duration other than the first duration.

19. An apparatus according to claim 18, wherein the plurality of light-receiving elements are linearly arranged in each of sensor chip, and the sensor chips are arranged in an array direction of the light-receiving elements.

20. A sensor chip for use in a multichip photoelectric conversion apparatus having a plurality of sensor chips, said chip comprising:

a plurality of light-receiving elements;

an input line for inputting a signal for initiating a reading of a signal from the light receiving elements using a shift register;

means for delaying generation of the initiating signal to delay the start of the signal reading operation; and a start signal deriving unit for outputting a signal used as an initiating signal to be supplied to a next stage sensor chip before an end of the reading of the signal from the plurality of light receiving elements.

21. A chip according to claim 20, wherein the sensor chip has a plurality of the light-receiving elements.

22. A chip according to claim 20, wherein each light-receiving element is arranged such that optical pumping carriers can be stored in a control electrode region of a transistor.

23. A chip according to claim 20, wherein said delaying means employs a shift register circuit.

24. A sensor chip for use in a multichip photoelectric conversion apparatus in which a plurality of sensor chips are arranged, wherein said sensor chip comprises:

a plurality of light-receiving elements;

an input line for inputting a signal for initiating a reading of a signal from the light-receiving elements using a shift register;

means for delaying generation of the initiating signal to delay the start of the signal reading operation; and a start signal deriving unit, electrically connected to said input line, for outputting a signal used as an initiating signal to be supplied to a next stage sensor chip before an end of the reading of the signal from the plurality of light-receiving elements.

25. An apparatus according to claim 24, wherein the sensor chip has a plurality of the light-receiving elements.

26. An apparatus according to claim 24, wherein each light-receiving element is arranged such that optical pumping carriers can be stored in a control electrode region of a transistor.

27. An apparatus according to claim 24, wherein said delaying means employs a shift register circuit.

28. A sensor chip for use in a multichip photoelectric conversion apparatus in which a plurality of sensor chips are arranged, wherein said sensor chip comprises:

a plurality of light-receiving elements;

an input line for inputting a signal for initiating a reading signal from the light-receiving elements;

means for delaying generation of the initiating signal to delay the start of the signal reading operation;

a start signal deriving unit, electrically connected to said input line, for outputting a signal used as an initiating signal to be supplied to a next stage sensor chip before an end of the reading signal from the plurality of light-receiving elements; and a constant current circuit of a light signal amplifier which is activated beforehand by the start signal.

29. A chip according to claim 28, wherein each light-receiving element comprises a type which stores optical pumping carriers in a control electrode region of a transistor.

30. A chip according to claim 28, further comprising a circuit for outputting a signal for sequentially selecting the light-receiving elements to drive a signal therefrom, and for operating said control circuit.

31. A chip according to claim 28, further comprising a common amplifier, and a second switch provided for an output signal line of said amplifier, wherein an output from said circuit is supplied to said common amplifier.

32. A chip according to claim 28, wherein the plurality of light-receiving elements are linearly arranged in each sensor chip, and wherein the sensor chips are arranged in an array direction of the light-receiving elements.

33. A sensor chip for use in a multi-chip type photoelectric conversion device wherein plural sensor chips are arranged, said sensor chip, comprising:

a plurality of light-receiving elements;

a circuit connected to each of said plurality of light-receiving elements;

a common output signal line for outputting signals from said chip;

an amplifier coupled to said circuit;

a signal extracting portion electrically connected between said output signal line and said amplifier for providing a signal from said circuit to outside the sensor chip;

a controller for connecting/disconnecting a signal output from said circuit and from said signal extracting portion; and a signal line for operating said controller.

34. A chip according to claim 33, wherein said circuit sequentially selects output signals from said plurality of light-receiving elements.

35. A chip according to claim 33, wherein said signal line is connected to said circuit.

36. A chip according to claim 33, wherein said amplifier is provided between said circuit and said signal extracting portion.

37. A chip according to claim 33, wherein said circuit is connected to an input line for inputting an external signal.

38. A chip according to claim 33, further comprising a switch provided between said light-receiving elements and said signal extracting portion, said switch receiving an output from said controller.

39. A chip according to claim 33, wherein each light-receiving element comprises an element for storing optical pumping carriers generated in accordance with optical information.

40. A chip according to claim 39, wherein said carriers are stored in a control electrode region of each light-receiving element.

41. A photoelectric conversion apparatus including a plurality of sensor chips, with each sensor chip comprising:

a plurality of light-receiving elements;

a shift register circuit connected to each of said plurality of light-receiving elements;

a common output signal line for outputting signals from said chip;

a signal extracting portion electrically connected to said output signal line for providing a signal from said shift register circuit to outside the sensor chip;

a controller for connecting/disconnecting a signal output from said shift register circuit and from said signal extracting portion; and a signal line for operating said controller, said signal line being connected to said shift register circuit, wherein signal extracting portions of the plurality of sensor chips are connected to a common signal line.

42. An apparatus according to claim 41, wherein said plurality of sensor chips are arranged such that light-receiving elements thereof are arranged in a line.

43. A reading apparatus comprising:

a photoelectric conversion apparatus including a plurality of sensor chips, with each sensor chip comprising:

a plurality of light-receiving elements;

a shift register circuit connected to each of said plurality of light-receiving elements;

a common output signal line for outputting signals from said chip;

an amplifier coupled to said shift register circuit;

a signal extracting portion electrically connected between said output signal line and said amplifier for providing a signal from said shift register circuit to outside the sensor chip, with said signal extracting portions of the sensor chips being connected to a common signal line;

a controller for connecting/disconnecting a signal output from said shift register circuit and from said signal extracting portion;

a signal line connected to said shift register circuit for operating said controller;

a signal processor for receiving an output signal from said photoelectric conversion apparatus; and a driver for driving said photoelectric conversion apparatus.

44. A sensor chip, comprising:

a plurality of light-receiving elements;

a circuit connected to each of said plurality of light-receiving elements;

a signal extracting portion electrically connected to an output signal line for extracting an output from said circuit to outside said sensor chip;

an amplifier for amplifying the output from said circuit;

a controller for controlling an operation state of said amplifier; and a signal line for operating said controller.

45. A chip according to claim 44, wherein said circuit sequentially selects output signals from said plurality of light-receiving elements.

46. A chip according to claim 44, wherein said signal line is connected to said circuit.

47. A chip according to claim 44, wherein said amplifier is provided between said circuit and said signal extracting portion.

48. A chip according to claim 44, wherein said circuit is connected to an input line for inputting an external signal.

49. A chip according to claim 44, wherein each light-receiving element is an element for storing optical pumping carriers generated in accordance with optical information.

50. A chip according to claim 49, wherein said carriers are stored in a control electrode region of said light-receiving element.

51. A photoelectric conversion apparatus including a plurality of sensor chips, with each sensor chip comprising:

a plurality of light-receiving elements;

a circuit connected to each of said plurality of light-receiving elements;

a signal extracting portion electrically connected to an output signal line for extracting an output from said circuit to outside said sensor chip;

an amplifier for amplifying the output from said circuit;

a controller for controlling an operation state of said amplifier; and a signal line for operating said controller.

52. An apparatus according to claim 51, wherein the sensor chips are arranged such that light-receiving elements of the sensor chips are arranged in a line.

53. A reading apparatus comprising:

a photoelectric conversion apparatus including a plurality of sensor chips, with each sensor chip comprising:

a plurality of light-receiving elements;

a circuit connected to each of said plurality of light-receiving elements;

a signal extracting portion electrically connected to an output signal line for extracting an output from said circuit to outside said sensor chip;

an amplifier for amplifying the output from said circuit;

a controller for controlling an operation state of said amplifier;

a signal line for operating said controller;

a signal processor for receiving an output signal from said photoelectric conversion apparatus; and a driver for driving said photoelectric conversion apparatus.

54. A method of reading a photoelectric conversion apparatus having:

a plurality of light-receiving elements;

an amplifier for receiving outputs from said light-receiving elements; and a controller for controlling an operation state of said amplifier, comprising the steps of:

enabling at least an amplifier of an nth sensor chip to be read; and enabling an amplifier of an (n+1)th sensor chip by a signal output on the basis of an operation of said nth sensor chip.

55. A method according to claim 54, wherein the signal output on the basis of the operation of said nth sensor chip is an output from said light-receiving element in said nth sensor chip or an output signal according to the output.

56. A sensor chip for use in a multichip photoelectric conversion apparatus having a plurality of sensor chips disposed in an array, said chip comprising:

a plurality of light-receiving elements;

a common output signal line for outputting a signal from the plurality of light-receiving elements of the sensor chip to outside of the sensor chip;

a first switch provided between said output signal line and the light-receiving elements for electrically switching said output signal line, said first switch being provided at a final stage of the chip;

a control circuit for outputting a signal for closing said first switch for a first duration, for outputting the signal from the light-receiving elements to the outside of the sensor chip, and for opening said first switch for a second duration other than the first duration; and a circuit for outputting a signal for opening and closing said first switch, for sequentially selecting the light-receiving elements to drive a signal therefrom, and for operating said control circuit, said circuit for sequentially selecting the light-receiving elements comprising a shift register.

57. A chip according to claim 56, wherein each light-receiving element comprises a type which stores optical pumping carriers in a control electrode region of a transistor.

58. A sensor chip for use in a multichip photoelectric conversion apparatus having a plurality of sensor chips disposed in an array, said chip comprising:

a plurality of light-receiving elements;

an output signal line for outputting a signal from the plurality of light-receiving elements of the sensor chip to outside of the sensor chip;

a first switch provided between said output signal line and the light-receiving elements for electrically switching said output signal line, said first switch being provided at a final stage of the chip;

a control circuit for outputting a signal for closing said first switch for a first duration, for outputting the signal from the light-receiving elements to the outside of the sensor chips and for opening said first switch for a second duration other than the first duration; and a circuit for outputting a signal for opening and closing said first switch, for sequentially selecting the light-receiving elements to drive a signal therefrom, and for operating said control circuit, said circuit for sequentially selecting the light-receiving elements comprising a shift register, further comprising a common amplifier, and a second switch provided for an output signal line of said amplifier, wherein an output from said circuit is supplied to said common amplifier.

59. A chip according to claim 56, wherein the pluarality of light-receiving elements are linearly arranged in each sensor chip, and wherein the sensor chips are arranged in an array direction of the light-receiving elements.

60. A multi-chip image sensing device comprising:

an output line; and plural image sensor chips arranged in series, each one of said image sensor chips respectively comprising:

plural photo receiving elements for converting a photo signal into an electric signal, signal detecting elements for detecting the electric signal from the photo receiving elements corresponding thereto respectively, transfer means including a shift register having series connected transfer stages for producing a reading pulse based on a control pulse, and for transferring a control pulse to the succeeding stages respectively, dummy transfer means including the transfer stages of the same structure as that of the shift register for transferring a control pulse received from a next previous one of said one image sensor chips to a first stage of the transfer stages of said one image sensor chip, switch means for outputting a detection output of said detecting elements to a common output line based on the reading pulse transferred from said shift register, and supplying means for supplying a pulse including the control pulse transferred from a selected transfer stage of said shift register of said one image sensor chip to a first stage of transfer stages of a next following image sensor chip as a control input, wherein said output line integrally outputs the output signals output from each common line of said image sensor chip.

* * * * *

UNITED STATES PATENT AND TRADEMARK OFFICE
CERTIFICATE OF CORRECTION

PATENT NO.   : 5,592,222
DATED        : January 7, 1997
INVENTOR(S)  : KENICHI NAKAMURA ET AL.

It is certified that error appears in the above-identified patent and that said Letters Patent is hereby corrected as shown below:

COLUMN 14

Line 13, "of" should be deleted.

COLUMN 18

Line 22, "chips" should read --chip,--.

Signed and Sealed this

Twenty-ninth Day of July, 1997

Attest:

BRUCE LEHMAN

Attesting Officer

Commissioner of Patents and Trademarks